(12) United States Patent
Take

(10) Patent No.: US 8,122,076 B2
(45) Date of Patent: Feb. 21, 2012

(54) DIGITAL-SIGNAL-PROCESSING APPARATUS AND METHOD

(75) Inventor: Masahiro Take, Kanagawa (JP)

(73) Assignee: Sony Corporation, Tokyo (JP)

( * ) Notice: Subject to any disclaimer, the term of this patent is extended or adjusted under 35 U.S.C. 154(b) by 1245 days.

(21) Appl. No.: 11/443,852

(22) Filed: May 31, 2006

(65) Prior Publication Data

US 2006/0291597 A1 Dec. 28, 2006

(30) Foreign Application Priority Data

Jun. 1, 2005 (JP) ................................ P2005-161864

(51) Int. Cl.
*G06F 17/10* (2006.01)
(52) U.S. Cl. .................... 708/300; 375/346; 375/350
(58) Field of Classification Search .................. None
See application file for complete search history.

(56) References Cited

U.S. PATENT DOCUMENTS

| 5,237,587 | A | * | 8/1993 | Schoolcraft | 375/150 |
| 5,448,576 | A | * | 9/1995 | Russell | 714/727 |
| 5,819,035 | A | * | 10/1998 | Devaney et al. | 709/202 |
| 5,835,237 | A | * | 11/1998 | Ebrahimi | 358/448 |
| 5,926,791 | A | * | 7/1999 | Ogata et al. | 704/500 |
| 6,011,814 | A | * | 1/2000 | Martinez et al. | 375/233 |
| 6,778,601 | B2 | * | 8/2004 | Ise et al. | 375/232 |
| 6,782,095 | B1 | * | 8/2004 | Leong et al. | 379/386 |

FOREIGN PATENT DOCUMENTS

| JP | 1 276880 | 11/1989 |
| JP | 7 143361 | 6/1995 |
| JP | 8-79558 | 3/1996 |
| JP | 9 135370 | 5/1997 |
| JP | 2001 45336 | 2/2001 |
| JP | 2004 236185 | 8/2004 |

* cited by examiner

*Primary Examiner* — Lewis Bullock, Jr.
*Assistant Examiner* — Michael Yaary
(74) *Attorney, Agent, or Firm* — Frommer Lawrence & Haug LLP; William S. Frommer; Thomas F. Presson

(57) ABSTRACT

Digital-signal-processing apparatus has a ringing-suppression-coefficient-generating device that generates a ringing suppression coefficient according to an amount of ringing occurred at an input signal, and a ringing suppression device that generates a ringing suppression signal based on high-frequency component of the input signal and the ringing suppression coefficient and suppresses the ringing by giving the ringing suppression signal to the input signal.

7 Claims, 7 Drawing Sheets

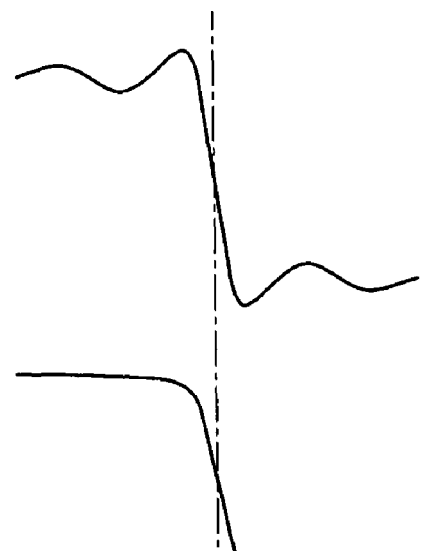
FIG. 5A (Din)
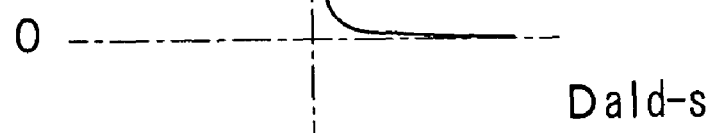
FIG. 5B (Dal)
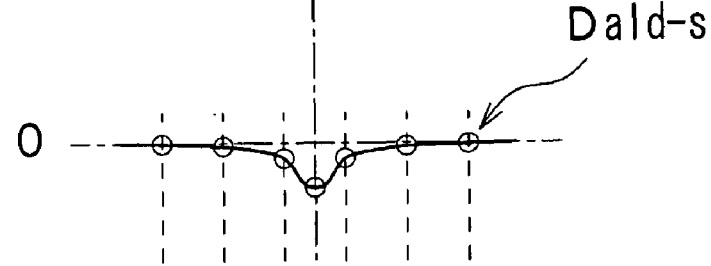
FIG. 5C (Dald)
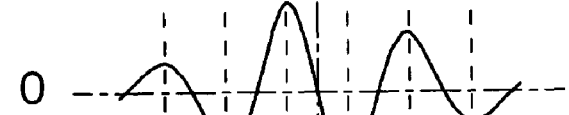
FIG. 5D (Dah)
FIG. 5E (TMp)
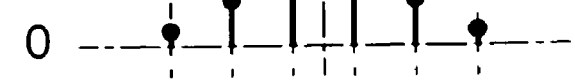
FIG. 5F (Ksr)

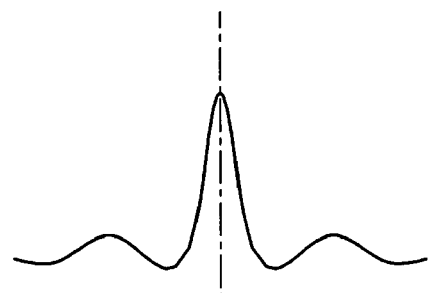
FIG. 6A (Din)
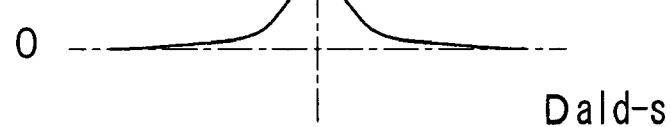
FIG. 6B (Dal)
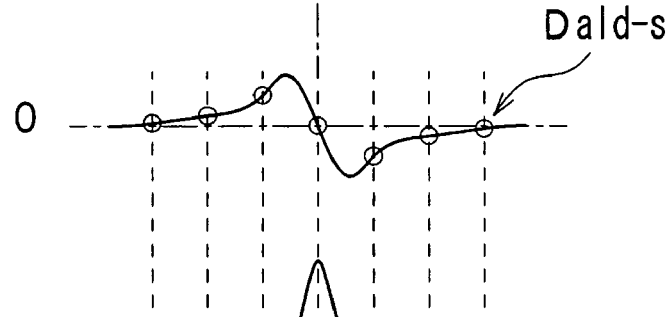
FIG. 6C (Dald)
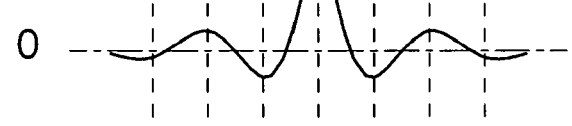
FIG. 6D (Dah)
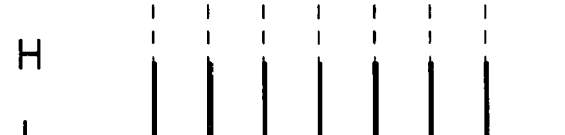
FIG. 6E (TMp)
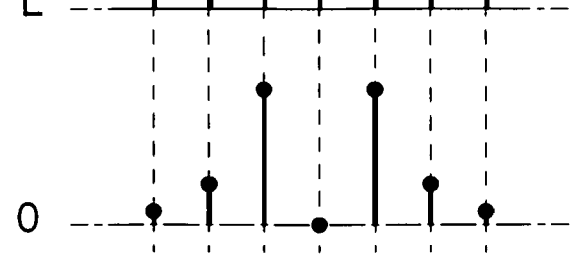
FIG. 6F (Ksr)

FIG. 7A (Din) 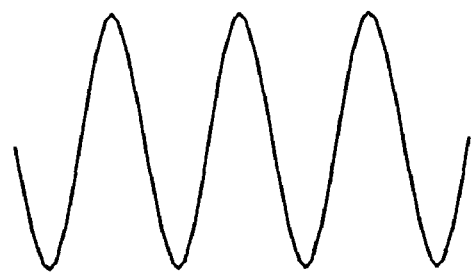
FIG. 7B (Dal) 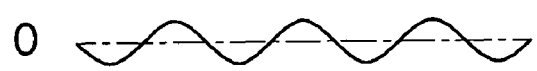
FIG. 7C (Dald) 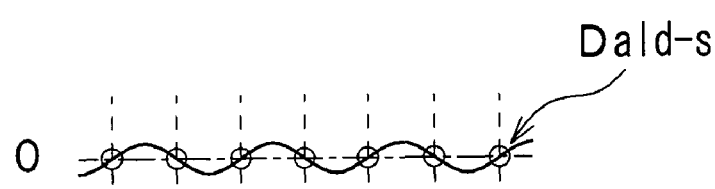
FIG. 7D (Dah) 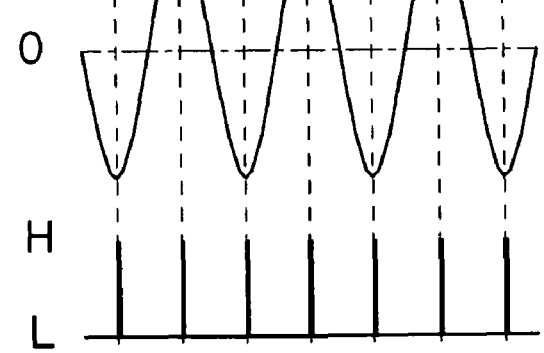
FIG. 7E (TMp) 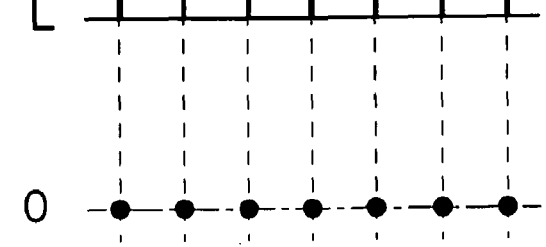
FIG. 7F (Ksr)

CTL

DIGITAL-SIGNAL-PROCESSING APPARATUS AND METHOD

CROSS REFERENCE TO RELATED APPLICATION

The present invention contains subject matter related to Japanese Patent Application No. JP2005-161864 filed in the Japanese Patent Office on Jun. 1st, 2005, the entire contents of which being incorporated herein by reference.

BACKGROUND OF THE INVENTION

1. Field of the Invention

This invention relates to digital-signal-processing apparatus and method as well as a program product therefor.

2. Description of Related Art

In the digital signal processing, a signal with a desired band width has been passed through a finite-duration impulse response (FIR) filter or an infinite-duration impulse response (IIR) filter. If processing the digital signal using the FIR filter, so-called Gibbs phenomenon in the Fourier transform occurs because an infinite impulse response of ideal filter is finitely carried out, thereby resulting in an occurrence of ringing in transition regions from a passing region to blocking region and vice versa.

In order to reduce such any adverse effect of the ringing, so-called window function to multiply a transition in the signal by a small coefficient has been used to suppress the ringing. Further, a first low-pass filter having a sharp blocking property and a second low-pass filter having a loose blocking property are provided and a mixture ratio of the digital signals output from the first and second low-pass filters alters near a position where a signal level alters like a step, thereby suppressing the ringing (see Japanese Patent Application Publication No. H08-79558).

SUMMARY OF THE INVENTION

If multiplying the transition in the signal by a small coefficient to suppress the ringing, it is insufficient to suppress the ringing when the blocking property in the filter has preference to a suppression of ringing. For instance, when processing any digital image signals by a high-order FIR filter, the ringing may occur at a portion of the image, which has a larger difference in contrasts, (an edge portion in the image changed from black to white and vice versa) to result in any deterioration of the image so that the edge can appear doubly or triply. On the other hand, when the suppression of ringing has preference to a blocking property in the filter, the blocking property in the filter may become looser to cause a less sharp image to be seen.

If the mixture ratio of the digital signals received from the first low-pass filter having the sharp blocking property and the second low-pass filters having the loose blocking property alters, it is insufficient to suppress the ringing when the blocking property in the filter has preference to a suppression of ringing by increasing a ratio of output from the first low-pass filter. On the other hand, the blocking property in the filter may become looser when the suppression of ringing has preference to a blocking property in the filter by increasing a ratio of output from the second low-pass filter.

It is desirable to present digital-signal-processing apparatus and method as well as a program product therefor, which can suppresses any ringing in an input signal without sacrificing any blocking property in the filter.

According to an embodiment of the present invention, there is provided a digital-signal-processing apparatus has a ringing-suppression-coefficient-generating device that generates a ringing suppression coefficient according to an amount of ringing occurred at an input signal. The apparatus also has a ringing suppression device that generates a ringing suppression signal based on high-frequency component of the input signal and the ringing suppression coefficient and suppresses the ringing by giving the ringing suppression signal to the input signal.

According to another embodiment of the present invention, there is provided a digital-signal-processing method. The method contains ringing-suppression-coefficient-generating step of generating a ringing suppression coefficient according to an amount of ringing occurred at an input signal. The method also contains ringing suppression step of generating a ringing suppression signal based on high-frequency component of the input signal and the ringing suppression coefficient and suppressing the ringing by giving the ringing suppression signal to the input signal.

According to further embodiment of the present invention, there is provided a program product that allows a computer to execute the above digital-signal-processing method.

According to any embodiments of the invention, the ringing suppression coefficient is generated according to an amount of ringing occurred at the input signal. The suppression signal is generated based on high-frequency component of the input signal and the ringing suppression coefficient. The ringing is suppressed by adding the ringing suppression signal to the input signal. This allows any ringing in the input signal to be suppressed without sacrificing any blocking property.

For example, by upsampling the input signal, the ringing suppression coefficient is generated based on a peak level of the high-frequency component in the input signal upsampled and a level fluctuation of low-frequency component of the input signal at a timing of the peak value.

For example, by performing zero-cross detection using a differential signal obtained by differentiating the high-frequency component of the input, the detected zero-cross position is set as a peak position. The ringing-suppression-coefficient-adjusting device can adjust the ringing suppression coefficient at the transition in the input signal.

The concluding portion of this specification particularly points out and directly claims the subject matter of the present invention. However those skills in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWINGS

FIGS. 5A through 5F are graphs each for illustrating operations for generating the ringing suppression coefficient when the input signal is a signal, an edge portion of which is filtered by FIR filter;

FIGS. 6A through 6F are graphs each for illustrating operations for generating the ringing suppression coefficient when the input signal is a signal, an impulse portion of which is filtered by FIR filter;

FIGS. 7A through 7F are graphs each for illustrating operations for generating the ringing suppression coefficient when the input signal is a continuous high-frequency signal;

DESCRIPTION OF THE PREFERRED EMBODIMENTS

Figure 1:
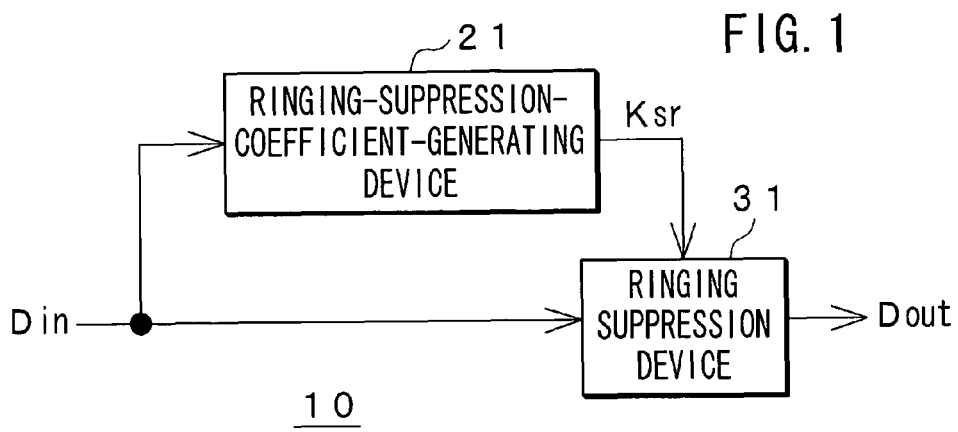
FIG. 1 is a block diagram for illustrating a configuration of an embodiment of a digital-signal-processing apparatus according to the invention.

The following will describe embodiments of the invention with reference to the accompanying drawings. FIG. 1 illustrates a configuration of an embodiment of a digital-signal-processing apparatus 10 according to the invention. The digital-signal-processing apparatus 10 has a ringing-suppression-coefficient-generating device 21 and a ringing suppression device 31. The ringing-suppression-coefficient-generating device 21 detects from an input signal Din a portion thereof in which ringing occurs, for example, a large transition in a signal level thereof such as an edge portion and an impulse portion that have been filtered by the FIR filter. The ringing-suppression-coefficient-generating device 21 then generates ringing suppression coefficient Ksr according to an amount of ringing. The ringing suppression device 31 suppresses the ringing occurred at the input signal Din using the ringing suppression coefficient Ksr generated in the ringing-suppression-coefficient-generating device 21.

Figure 2:
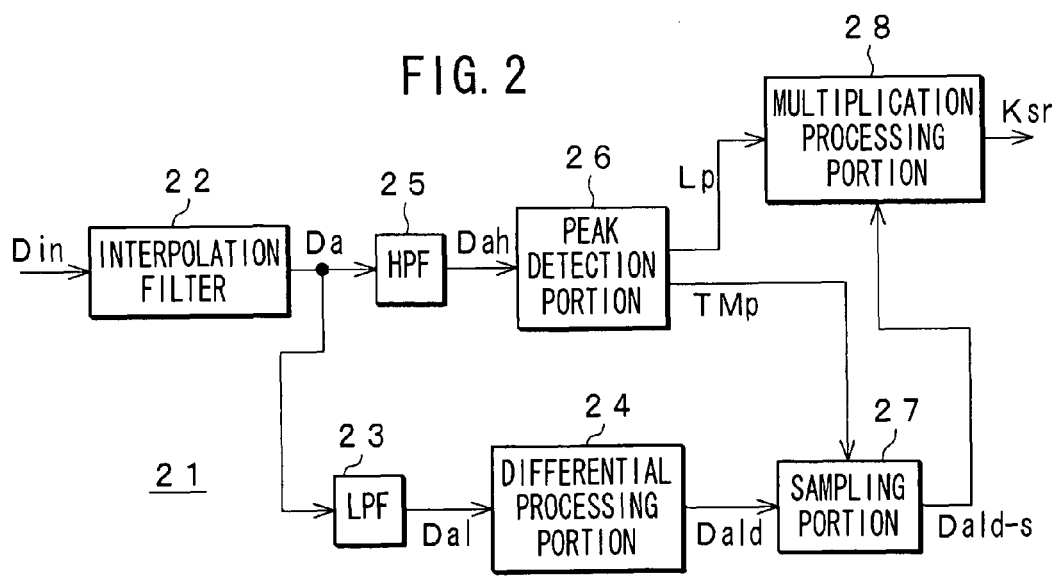
FIG. 2 is a block diagram for illustrating a configuration of a ringing-suppression-coefficient-generating device.

FIG. 2 illustrates a configuration of the ringing-suppression-coefficient-generating device 21. The ringing-suppression-coefficient-generating device 21 generates the ringing suppression coefficient Ksr according to an amount of the ringing occurred at the input signal Din.

If ringing occurs when a signal of the edge portion or the impulse portion is filtered by the FIR filter, a ringing-occurred portion of the signal has a large amount of energy in a high-frequency region thereof and a level fluctuation in a low-frequency region thereof. Any signal passing through the FIR filter such as a continuous high-frequency signal, not such the signal of the edge portion or the impulse portion, has a large amount of energy in a high-frequency region thereof but has not any large level fluctuation in a low-frequency region thereof. Thus, the ringing-suppression-coefficient-generating device 21 detects energy in a high-frequency region of the input signal and detects level fluctuation in a low-frequency region thereof (differential detection) at the same time. The ringing-suppression-coefficient-generating device 21 then generates ringing suppression coefficient Ksr according to an amount of the ringing using such two species of detection results.

The input signal Din is supplied to an interpolation filter 22. The interpolation filter 22 upsamples the input signal Din using any calculation during less than one clock of the input signal Din to suppress the ringing and supplies the upsampled signal as the signal Da to a low pass filter (LPF) 23 and to a high pass filter (HPF) 25.

The LPF 23 extracts the low-frequency region from the signal Da and supplies it to a differential processing portion 24 as the low-frequency signal Dal. The differential processing portion 24 differentiates the low-frequency signal Dal received from the LPF 23 and generates a low-frequency fluctuation signal Dald to supply it to a sampling portion 27.

The HPF 25 extracts the high-frequency region from the signal Da and supplies it to a peak detection portion 26 as the high-frequency signal Dah. The peak detection portion 26 detects each peak level Lp in the high-frequency signal Dah and supplies the detected peak levels to a multiplication processing portion 28. The peak detection portion 26 also generates a timing signal TMp indicating a phase when a signal level of the high-frequency signal Dah exhibits a peak to supply the generated timing signal TMp to the sampling portion 27.

Figure 3:
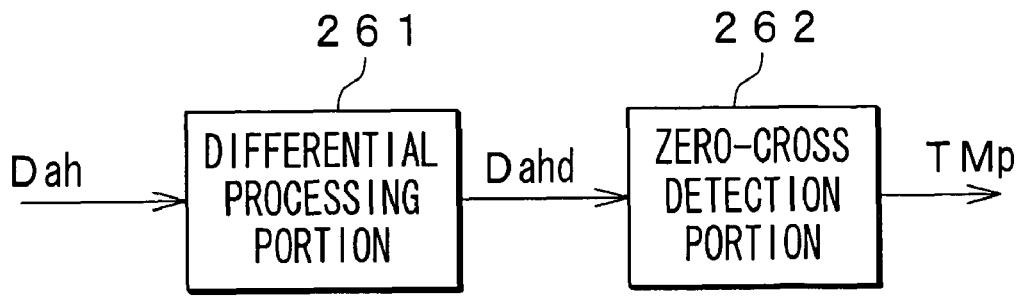
FIG. 3 is a block diagram for illustrating a configuration of a part of a peak detection portion.

FIG. 3 illustrates a configuration of a part of the peak detection portion 26. The peak detection portion 26 generates the timing signal TMp. In the peak detection portion 26, a differential processing portion 261 receives the high-frequency signal Dah from the HPF 25. The differential processing portion 261 generates a differentiated signal Dahd from the high-frequency signal Dah and supplies the generated differentiated signal Dahd to a zero-cross detection portion 262. The zero-cross detection portion 262 detects a zero-cross position of the differentiated signal Dahd received from the differential processing portion 261 and generates a signal indicating this zero-cross position as the timing signal TMp indicating phases relative to the peaked levels. When differentiating the high-frequency signal Dah, the differentiated signal Dahd exhibits zero at the peak position of the high-frequency signal Dah. Thus, the detection of the zero-cross position of the differentiated signal Dahd by the zero-cross detection portion 262 enables phases each in which a signal level of the high-frequency signal Dah exhibits a peak to be detected.

The sampling portion 27 samples the low-frequency fluctuation signal Dald based on the timing signal TMp received from the peak detection portion 26 when the signal level of the high-frequency signal Dah exhibits the peaks and supplies a sampled low-frequency fluctuation signal Dald-s to the multiplication processing portion 28.

The multiplication processing portion 28 multiplies each of the peak levels Lp of the high-frequency signal Dah by the sampled low-frequency fluctuation signal Dald-s. Further, the multiplication processing portion 28 performs normalization on absolute values of any multiplied results to generate ringing suppression coefficient Ksr according to an amount of the ringing. This ringing suppression coefficient Ksr is normalized so that the coefficient Ksr can be 1 when the absolute value of multiplied result is maximum value.

Figure 4:
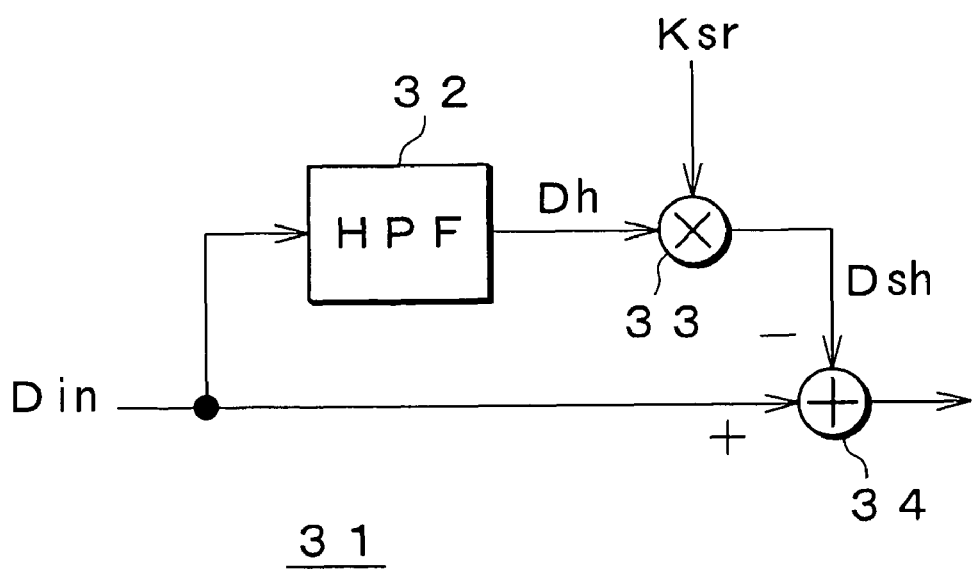
FIG. 4 is a block diagram for illustrating a configuration of a ringing suppression device.

FIG. 4 illustrates a configuration of the ringing suppression device 31. A high pass filter (HPF) 32 and a subtracter 34 receive the input signal Din. The HPF 32 extracts a high-frequency component from the input signal Din and supplies it to a multiplier 33 as a high-frequency signal Dh.

The multiplier 33 multiplies the high-frequency signal Dh extracted with the HPF 32 by the ringing suppression coefficient Ksr to generate a ringing suppression signal Dsh. The multiplier 33 supplies the ringing suppression signal Dsh to the subtracter 34.

The subtracter 34 subtracts the received ringing suppression signal Dsh from the input signal Din to suppress any ringing in the input signal Din, thereby generating an output signal Dout.

The following will describe operations of an embodiment of the digital-signal-processing apparatus according to the invention. FIGS. 5A through 5F illustrate operations for generating the ringing suppression coefficient when the input signal Din is a signal, an edge portion of which is filtered by FIR filter. If the LPF 23 receives the input signal Din shown in FIG. 5A, the LPF 23 transmits the low-frequency signal Dal, shown in FIG. 5B, which is filtered, to the differential processing portion 24. The differential processing portion 24 differentiates the low-frequency signal Dal to generate the low-frequency fluctuation signal Dald shown in FIG. 5C and supply it to the sampling portion 27.

The HPF 25 transmits the high-frequency signal Dah, shown in FIG. 5D, which is filtered, to the peak detection portion 26. The peak detection portion 26 detects peaks of signal level of the high-frequency signal Dah to generate the timing signal TMp shown in FIG. 5E and supply it to the sampling portion 27. It is to be noted that FIG. 5E illustrates a case where a signal level of the high-frequency signal Dah is a peak level when the timing signal TMp exhibits a high level "H".

The sampling portion 27 samples the low-frequency fluctuation signal Dald based on the timing signal TMp and supplies the sampled low-frequency fluctuation signal Dald-s to the multiplication processing portion 28. The multiplication processing portion 28 multiplies the peak levels Lp of the high-frequency signal Dah by the low-frequency fluctuation signal Dald-s (plotted any encircled points in FIG. 5C) sampled by the sampling portion 27 to normalize it in order to obtain absolute values of the multiplied results, thereby generating the ringing suppress coefficient Ksr shown in FIG. 5F. It is to be noted that the ringing suppression coefficient Ksr has two portions that are almost symmetrical to each other with respect to a center of the transition region when receiving an edge signal as the input signal.

FIGS. 6A through 6F illustrate operations for generating the ringing suppression coefficient when the input signal Din is a signal, an impulse portion of which is filtered by FIR filter. FIG. 6A shows the input signal Din; FIG. 6B shows the low-frequency signal Dal; FIG. 6C shows the low-frequency fluctuation signal Dald; FIG. 6D shows the high-frequency signal Dah; FIG. 6E shows the timing signal TMp; and FIG. 6F shows the ringing suppress coefficient Ksr.

It is to be noted that the ringing suppression coefficient Ksr has two portions that are almost symmetrical to each other with respect to a center of the impulse when the input signal Din is a signal, an impulse portion of which is filtered by FIR filter.

FIGS. 7A through 7F illustrate operations for generating the ringing suppression coefficient when the input signal is a continuous high-frequency signal. FIG. 7A shows the input signal Din; FIG. 7B shows the low-frequency signal Dal; FIG. 7C shows the low-frequency fluctuation signal Dald; FIG. 7D shows the high-frequency signal Dah; FIG. 7E shows the timing signal TMp; and FIG. 7F shows the ringing suppress coefficient Ksr. In this case, when receiving a continuous high-frequency signal passed through the HPF 25, the LPF 23 transmits no output because such the signal has no energy in a low frequency region thereof. Actually, since it is difficult to configure the HPF 25 and the LPF 23 so that regions of the HPF 25 and the LPF 23 are not overlapped at all and no signal having a single frequency enters thereinto, the LPF 23 transmits an output including any signals as shown in FIG. 7B. The low-frequency fluctuation signal Dald, however, obtained by differentiating the low-frequency signal Dal that is received from the LPF 23 by the differential processing portion 24 has a phase that is deviated 90 degrees from the low-frequency signal (the input signal). When the high-frequency signal Dah is peaked, a signal level of the low-frequency fluctuation signal Dald ideally becomes almost zero. Thus, the ringing suppress coefficient Ksr also becomes zero when receiving the continuous high-frequency signal.

Thus, it can be determined that an input signal is a signal, an edge portion or an impulse portion of which is filtered by FIR filter, if a signal level when sampling the low-frequency fluctuation signal Dald at a peaked phase of the high-frequency signal Dah is not about zero.

A threshold value is set to the high-frequency signal Dah received from the HPF 25 and when a signal level of the high-frequency signal Dah is higher than the threshold value, the peaked phase can be detected. Alternatively, when a threshold value is set to the low-frequency fluctuation signal Dald and a signal level of the low-frequency fluctuation signal Dald is higher than the threshold value, the ringing suppression coefficient Ksr corresponding to the edge portion or the impulse portion can be generated if the sampling is performed at the peaked phase.

Further, a history of changes made to the signal levels of low-frequency fluctuation signal Dald relative to any contiguous peaked phases is kept and then, it is possible to determine that the input signal Din is an edge portion or an impulse portion that is filtered by the FIR filter. For example, it is determined that the input signal is the impulse portion that is filtered by the FIR filter when a signal level of the low-frequency fluctuation signal Dald increases and then, decreases below the zero level to return to the zero level.

If it is conceivable that an amount of generated ringing is obtained by multiplying any energy of the high-frequency region by low-frequency fluctuation, the amount of generated ringing is obtained by multiplying each of the peal levels of the high-frequency signal Dah by a signal level of the low-frequency fluctuation signal Dald, thereby making the ringing suppression coefficient Ksr relative to the amount of generated ringing.

Multiplying the ringing suppression coefficient Ksr thus obtained and the high-frequency signal Dh received from the HPF 32 in the ringing suppression device 31 together allows the ringing suppression signal Dsh with a signal level according to an amount of generated ringing to be generated. The subtracter 34 subtracts this ringing suppression signal Dsh from the input signal Din and then, cancels the ringing component with the ringing suppression signal Dsh to generate an output signal Dout in which any ringing can be suppressed.

Figure 8:
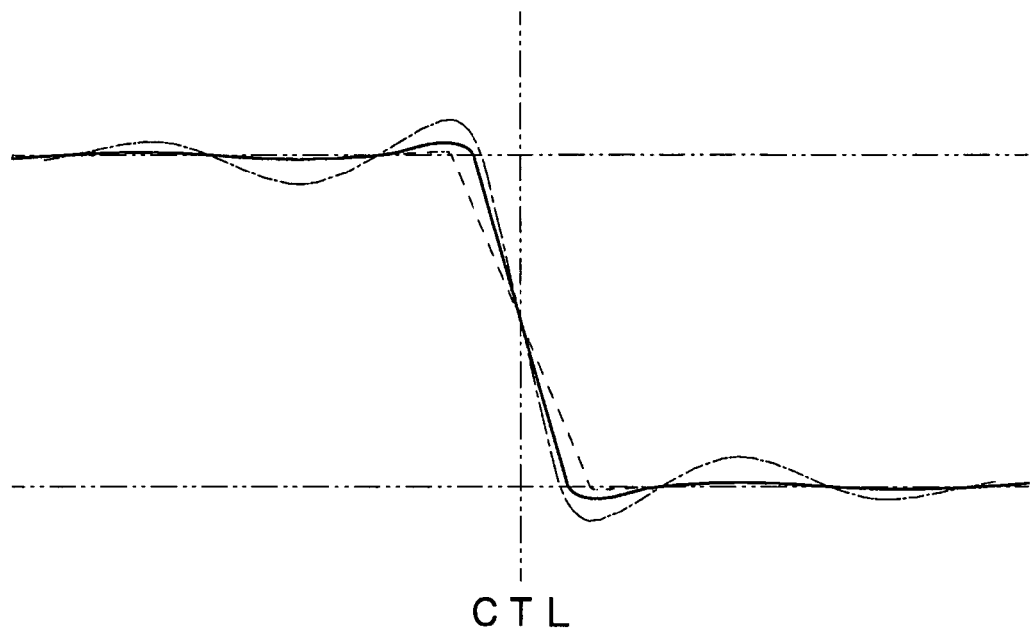
FIG. 8 is a graph for illustrating operations when changing the ringing suppression coefficient.

In these embodiments, the suppression of ringing is not limited to a case where the calculated ringing suppression coefficient Ksr is used as it is. It is possible to adjust the ringing suppression coefficient Ksr in the transition region independently. For example, if the input signal Din is a signal, an impulse portion of which is filtered by the FIR filter, a slew rate can be raised as a solid line shown in FIG. 8 by decreasing the ringing suppression coefficients Ksr of both sides with respect to a center CTL of the transition region, as compared with a case where the ringing suppression coefficient Ksr is used as it is (as being illustrated by a dotted line shown in FIG. 8). It is to be noted that an alternate long and short dashed line indicates a state before the ringing suppression in FIG. 8.

If a number of taps in the HPF 32 of the ringing suppression device 31 equals to that of the FIR filters of previous stage, it is possible to sample all the ringing occurred in the FIR filters of previous stage and to compensate it.

Figure 9:
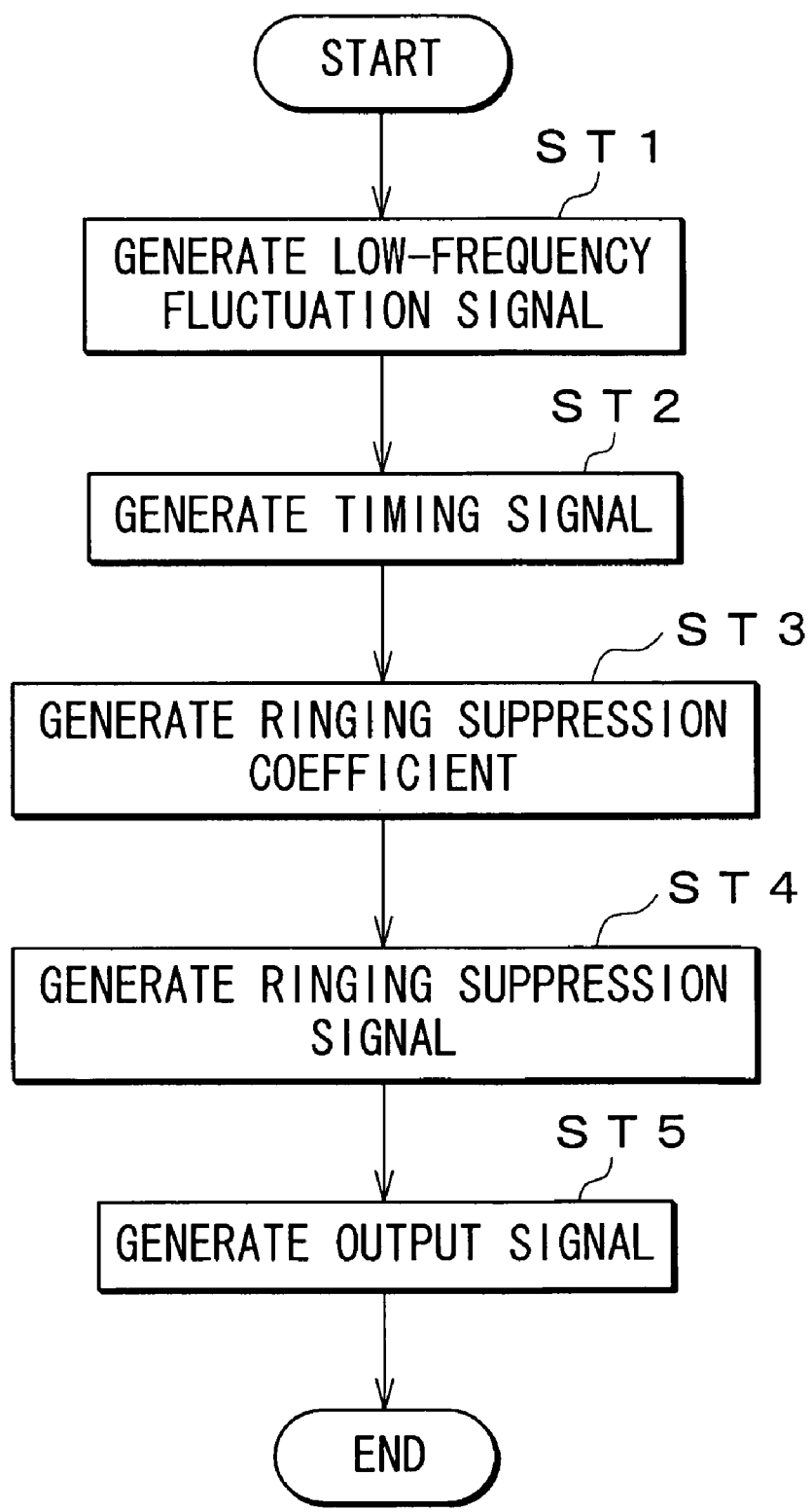
FIG. 9 is a flowchart for showing ringing suppression processing.

The above ringing suppression processing can be carried out with software. In this case, the software is previously stored in a memory or a recording medium or supplied via a communication line. A program relative to the software that is read out of the memory or the recording medium or supplied via the communication line is carried out to implement the ringing suppression processing shown in FIG. 9. It is to be noted that a control unit, not shown, constituted of a micro processor in a computer, a digital signal processing apparatus or the like carries out the program.

At step ST1, the control unit generates the low-frequency fluctuation signal Dald. In the generation of low-frequency fluctuation signal Dald, the input signal Din is upsampled and then, filtered by the low pass filter. The filtered signal is differentiated to generate the low-frequency fluctuation signal Dald.

At step ST 2, the control unit generates the timing signal TMp. In the generation of timing signal TMp, the input signal Din is upsampled and then, filtered by the high-pass filter, thereby generating the timing signal TMp indicating a peak position of the filtered signal.

At step ST3, the control unit generates the ringing suppression coefficient Ksr. In the generation of ringing suppression coefficient Ksr, based on the timing signal TMp generated at the step ST2, a signal level of the low-frequency fluctuation signal Dald at the peak position is multiplied by a signal level of the high-frequency signal Dah and then, the absolute vale of the multiplied result is normalized, thereby generating the ringing suppression coefficient Ksr.

At step ST4, the control unit generates the ringing suppression signal Dsh. In the generation of ringing suppression signal Dsh, the ringing suppression coefficient Ksr generated at the step ST3 is multiplied by the high-frequency signal Dh obtained by filtering the input signal Din with the high pass filter, thereby generating the ringing suppression signal Dsh.

At step ST5, the control unit generates the output signal Dout. In the generation of output signal Dout, the ringing suppression signal Dsh generated at the step ST4 is a signal corresponding to the ringing component so that the ringing suppression signal Dsh is subtracted from the input signal Din, thereby generating the output signal Dout in which the ringing component is suppressed.

According to the above embodiments, even if ringing occurs at FIR filtering, it is possible to reduce any adverse effect by the ringing without sacrificing any blocking property thereof. It is also possible to prevent a contour from being doubly or triply seen by the edge signal or the impulse signal when a frequency property thereof is preceded at FIR filtering.

It should be understood by those skilled in the art that various modifications, combinations, sub-combinations and alterations may occur depending on design requirements and other factors insofar as they are within the scope of the appended claims or the equivalents thereof.

What is claimed is:

1. A digital-signal-processing apparatus comprising:
a ringing-suppression-coefficient-generating device that detects energy in a high-frequency region of an input signal to obtain an energy detection result, detects level fluctuation in a low-frequency region of the input signal to obtain a level fluctuation detection result at a same time, and generates a ringing suppression coefficient according to an amount of ringing occurred at the input signal using the energy detection result and the level fluctuation detection result; and
a ringing suppression device that generates a ringing suppression signal based on high-frequency component of the input signal and the ringing suppression coefficient and suppresses the ringing by giving the ringing suppression signal to the input signal,
wherein a control unit generates a low-frequency fluctuation signal by upsampling the input signal, filtering using a low pass filter, and differentiating the filtered signal,
wherein the control unit generates a timing signal indicating a peak position of the high-frequency component by upsampling the input signal, and filtering using a high-pass filter, and
wherein a sampling unit samples the low-frequency fluctuation signal based on the timing signal indicating the peak position of the high-frequency component when a signal level of the high-frequency component exhibits peaks.

2. The digital-signal-processing apparatus according to claim 1, wherein the ringing-suppression-coefficient-generating device generates the ringing suppression coefficient based on a peak level of the high-frequency component in the input signal and a level fluctuation of low-frequency component of the input signal at a timing of the peak level.

3. The digital-signal-processing apparatus according to claim 2, wherein the ringing-suppression-coefficient-generating device upsamples the input signal and uses the high-frequency component and the low-frequency component of the input signal thus upsampled.

4. The digital-signal-processing apparatus according to claim 2, wherein the ringing-suppression-coefficient-generating device performs zero-cross detection using a differential signal relative to the high-frequency component of the input and sets the detected zero-cross position as a peak position.

5. The digital-signal-processing apparatus according to claim 1, wherein the ringing suppression coefficient at the transition in the input signal is independently adjusted.

6. Digital-signal-processing method carried out by a computer, the method comprising the steps of:
a ringing-suppression-coefficient-generating step of detecting energy in a high-frequency region of an input signal to obtain an energy detection result, detecting level fluctuation in a low-frequency region of the input signal to obtain a level fluctuation detection result at a same time, and generating a ringing suppression coefficient according to an amount of ringing occurring at the input signal using the energy detection result and the level fluctuation detection result; and
a ringing suppression step of generating a ringing suppression signal based on high-frequency component of the input signal and the ringing suppression coefficient and suppressing the ringing by giving the ringing suppression signal to the input signal,
wherein a control step generates a low-frequency fluctuation signal by upsampling the input signal, filtering using a low pass filter, and differentiating the filtered signal,
wherein the control step generates a timing signal indicating a peak position of the high-frequency component by upsampling the input signal, and filtering using a high-pass filter, and
wherein a sampling step samples the low-frequency fluctuation signal based on the timing signal indicating the peak position of the high-frequency component when a signal level of the high-frequency component exhibits peaks.

7. A program recorded on a non-transitory computer-readable medium that allows a computer to execute a method, said method comprising the steps of:
a ringing-suppression-coefficient-generating step of detecting energy in a high-frequency region of an input signal to obtain an energy detection result, detecting level fluctuation in a low-frequency region of the input signal to obtain a level fluctuation detection result at a same time, and generating a ringing suppression coefficient according to an amount of ringing occurred at the input signal using the energy detection result and the level fluctuation detection result; and
ringing suppression step of generating a ringing suppression signal based on high-frequency component of the input signal and the ringing suppression coefficient and suppressing the ringing by giving the ringing suppression signal to the input signal, wherein a control step generates a low-frequency fluctuation signal by upsampling the input signal, filtering using a low pass filter, and differentiating the filtered signal, wherein the control step generates a timing signal indicating a peak position of the high-frequency component by upsampling the input signal, and filtering using a high-pass filter, and wherein a sampling step samples the low-frequency fluctuation signal based on the timing signal indicating the peak position of the high-frequency component when a signal level of the high-frequency component exhibits peaks.

* * * * *